(12) United States Patent
    Toyoshima

(10) Patent No.: US 12,652,874 B2
(45) Date of Patent: Jun. 9, 2026

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventor: Takahiro Toyoshima, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 318 days.

(21) Appl. No.: 18/263,311

(22) PCT Filed: Dec. 17, 2021

(86) PCT No.: PCT/JP2021/046659
    § 371 (c)(1),
    (2) Date: Jul. 27, 2023

(87) PCT Pub. No.: WO2022/168465
    PCT Pub. Date: Aug. 11, 2022

(65) Prior Publication Data
    US 2024/0088183 A1      Mar. 14, 2024

(30) Foreign Application Priority Data

Feb. 4, 2021    (JP) ................................. 2021-016300

(51) Int. Cl.
    H10F 39/00          (2025.01)
    H04N 25/633         (2023.01)
        (Continued)

(52) U.S. Cl.
    CPC ....... H10F 39/8057 (2025.01); H04N 25/633 (2023.01); H04N 25/70 (2023.01);
        (Continued)

(58) Field of Classification Search
    CPC .... H10F 39/8057; H10F 39/182; H10F 30/20; H10F 39/12; H10F 39/807; H04N 25/60;
        (Continued)

(56) References Cited

U.S. PATENT DOCUMENTS

2012/0025059 A1*    2/2012   Kawashima ........ H10F 39/8053
                                                        257/435

FOREIGN PATENT DOCUMENTS

JP          2012009791 A  *  1/2012  ............. H01L 21/76
JP          2012-033583 A      2/2012
        (Continued)

OTHER PUBLICATIONS

International Search Report and Written Opinion of PCT Application No. PCT/JP2021/046659, issued on Mar. 8, 2022, 09 pages of ISRWO.

*Primary Examiner* — Twyler L Haskins
*Assistant Examiner* — Akshay Trehan
(74) *Attorney, Agent, or Firm* — CHIP LAW GROUP

(57)                ABSTRACT

Provided is a solid-state imaging device capable of obtaining an image with a higher image quality. The solid-state imaging device includes a substrate, a pixel region formed on the substrate and configured such that a plurality of pixels is arrayed therein, a dug structure formed in the pixel region, and a p-type semiconductor region formed in a region adjacent to the dug structure in the substrate. Further, the pixel region is divided into an effective pixel region where effective pixels including photoelectric conversion units not shielded from light are arrayed and an OPB pixel region formed adjacent to the effective pixel region and configured such that light shielding pixels including photoelectric conversion units shielded from light are arrayed therein. In addition, in plan view, the percentage of an area occupied by the dug structure in the OPB pixel region is smaller than the
                (Continued)

percentage of an area occupied by the dug structure in the effective pixel region.

8 Claims, 9 Drawing Sheets

(51) Int. Cl.
| | |
|---|---|
| *H04N 25/70* | (2023.01) |
| *H10F 30/20* | (2025.01) |
| *H10F 39/12* | (2025.01) |
| *H10F 39/18* | (2025.01) |

(52) U.S. Cl.
CPC ............. *H10F 30/20* (2025.01); *H10F 39/12* (2025.01); *H10F 39/182* (2025.01); *H10F 39/807* (2025.01)

(58) Field of Classification Search
CPC ................. H04N 25/63; H04N 25/633; H04N 25/70–79; H04N 25/10–135; H04N 23/10; H04N 23/55
See application file for complete search history.

(56) References Cited

FOREIGN PATENT DOCUMENTS

| | | | |
|---|---|---|---|
| JP | 2013-175494 A | 9/2013 | |
| JP | 2020-136429 A | 8/2020 | |
| WO | WO-2020235589 A1 * | 11/2020 | ............. H04N 25/70 |

* cited by examiner

SOLID-STATE IMAGING DEVICE AND ELECTRONIC DEVICE

CROSS REFERENCE TO RELATED APPLICATIONS

This application is a U.S. National Phase of International Patent Application No. PCT/JP2021/046659 filed on Dec. 17, 2021, which claims priority benefit of Japanese Patent Application No. JP 2021-016300 filed in the Japan Patent Office on Feb. 4, 2021. Each of the above-referenced applications is hereby incorporated herein by reference in its entirety.

TECHNICAL FIELD

The present technology relates to a solid-state imaging device and an electronic device.

BACKGROUND ART

Conventionally, for example, a solid-state imaging device including a plurality of pixels formed on a substrate and a trench part dug into a region of the substrate between adjacent pixels has been proposed (see, for example, Patent Document 1). The solid-state imaging device described in Patent Document 1 further includes a p-type semiconductor region in a region around the trench part in the substrate, and electrons generated due to damage (defect) of the substrate caused by formation of the trench part are absorbed by holes of the p-type semiconductor region and a dark current is reduced accordingly, whereby improving image quality.

CITATION LIST

Patent Document

Patent Document 1: Japanese Patent Application Laid-Open No. 2013-175494

SUMMARY OF THE INVENTION

Problems to be Solved by the Invention

For such a solid-state imaging device, further improvement in image quality is required.

An object of the present disclosure is to provide a solid-state imaging device and an electronic device capable of obtaining an image with a higher image quality.

Solutions to Problems

A solid-state imaging device of the present disclosure includes (a) a substrate, (b) a pixel region formed on the substrate and configured such that a plurality of pixels is arrayed therein, (c) a dug structure formed in the pixel region, and (d) a p-type semiconductor region formed in a region adjacent to the dug structure in the substrate. (e) The pixel region is divided into an effective pixel region where effective pixels including photoelectric conversion units not shielded from light are arrayed and an OPB pixel region formed adjacent to the effective pixel region and configured such that light shielding pixels including photoelectric conversion units shielded from light are arrayed therein. (f) In plan view, the percentage of an area occupied by the dug structure in the OPB pixel region is smaller than the percentage of an area occupied by the dug structure in the effective pixel region.

Further, an electronic device of the present disclosure includes a solid-state imaging device having (a) a substrate, (b) a pixel region formed on the substrate and configured such that a plurality of pixels is arrayed therein, (c) a dug structure formed in the pixel region, and (d) a p-type semiconductor region formed in a region adjacent to the dug structure in the substrate. (e) The pixel region is divided into an effective pixel region where effective pixels including photoelectric conversion units not shielded from light are arrayed and an OPB pixel region formed adjacent to the effective pixel region and configured such that light shielding pixels including photoelectric conversion units shielded from light are arrayed therein. (f) In plan view, the percentage of an area occupied by the dug structure in the OPB pixel region is smaller than the percentage of an area occupied by the dug structure in the effective pixel region.

MODES FOR CARRYING OUT THE INVENTION

The present inventors have found the following problems in the solid-state imaging device described in Patent Document 1.

In the solid-state imaging device described in Patent Document 1, in an OPB pixel region, even if the p-type semiconductor region is formed, unlike an effective pixel region, in the region adjacent to the trench part in the substrate, a dark current is not reduced in some cases. For this reason, there is a probability that a difference between the dark current in the OPB pixel region and the dark current in the effective pixel region increases, a black level is not appropriately adjusted, and the quality of an obtained image is degraded.

Hereinafter, an example of a solid-state imaging device 1 and an electronic device according to an embodiment of the present disclosure will be described with reference to FIGS. 1, 2A, 2B, 3A, 3B, 4, 5A, 5B, 6A, 6B, and 7. The embodiments of the present disclosure will be described in the following order. Note that the present disclosure is not limited to the following examples. In addition, the effects described in the present specification are illustrative and not restrictive, and may have additional effects.

1. First embodiment: solid-state imaging device
    1-1 Overall configuration of solid-state imaging device
    1-2 Configuration of main part
    1-3 Modifications
2 Second embodiment: electronic device 1. First Embodiment: Solid-State Imaging Device

[1-1 Overall Configuration of Solid-State Imaging Device]

A solid-state imaging device 1 according to a first embodiment of the present disclosure will be described.

Figure 1:
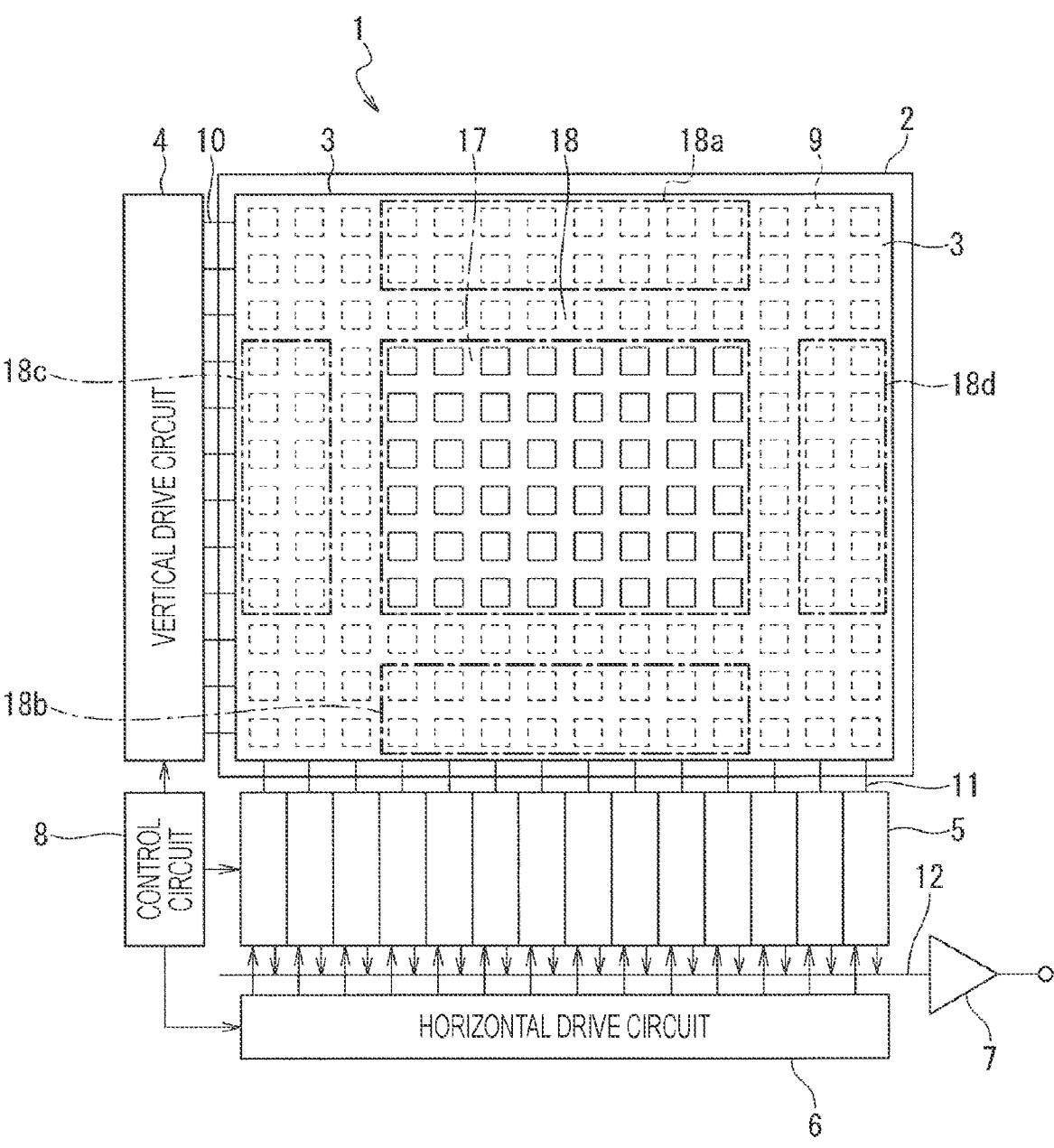
FIG. 1 is a diagram illustrating an overall configuration of a solid-state imaging device according to a first embodiment.
Figure 7:
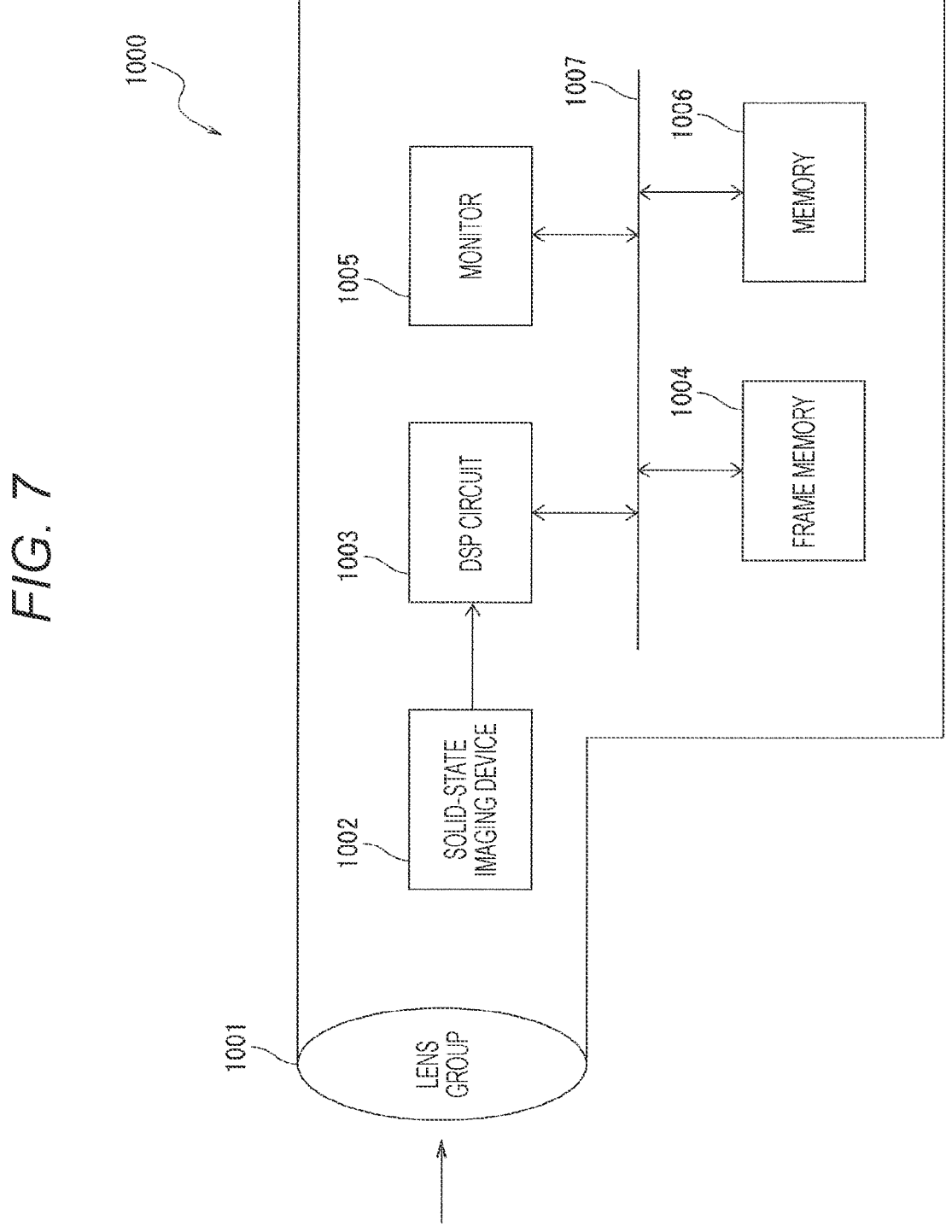
FIG. 7 is a diagram illustrating an overall configuration of an electronic device according to a second embodiment.

FIG. 1 is a diagram illustrating an overall configuration of the solid-state imaging device 1 according to the first embodiment. The solid-state imaging device 1 in FIG. 1 is a back-illuminated complementary metal oxide semiconductor (CMOS) image sensor. As illustrated in FIG. 7, the solid-state imaging device 1 (solid-state imaging device 1002) captures image light (incident light) from a subject via a lens group 1001, converts a light amount of the incident light formed on an imaging surface into an electrical signal on a pixel basis, and outputs the electrical signal as a pixel signal.

As illustrated in FIG. 1, the solid-state imaging device 1 includes a substrate 2, a pixel region 3, a vertical drive circuit 4, a column signal processing circuit 5, a horizontal drive circuit 6, an output circuit 7, and a control circuit 8. The vertical drive circuit 4, the column signal processing circuit 5, the horizontal drive circuit 6, the output circuit 7, and the control circuit 8 are formed on a logic substrate (not illustrated) stacked together with a sensor substrate including the substrate 2.

The pixel region 3 has a plurality of pixels 9 formed on the substrate 2 and disposed in a two-dimensional matrix shape. The pixel 9 has a photoelectric conversion unit 19 illustrated in FIGS. 2A and 2B and a plurality of pixel transistors (not illustrated). As the pixel transistors, four transistors that are a transfer transistor, a reset transistor, a selection transistor, and an amplifier transistor can be employed, for example. In addition, for example, three transistors other than the selection transistor may be used.

The vertical drive circuit 4 includes, for example, a shift register, selects a desired pixel drive wiring 10, supplies a pulse for driving the pixels 9 to the selected pixel drive wiring 10, and drives each pixel 9 on a row basis. That is, the vertical drive circuit 4 selectively scans each pixel 9 in the pixel region 3 sequentially in a vertical direction on a row basis, and supplies a pixel signal based on a signal charge generated in accordance with an amount of received light in the photoelectric conversion unit 19 of each pixel 9, to the column signal processing circuit 5 through a vertical signal line 11.

The column signal processing circuit 5 is disposed, for example, for each column of the pixels 9, and performs signal processing such as noise removal on signals outputted from the pixels 9 of one line for each pixel column. For example, the column signal processing circuit 5 performs signal processing such as correlated double sampling (CDS) for removing fixed pattern noise unique to pixels, and analog-digital (AD) conversion.

The horizontal drive circuit 6 includes, for example, a shift register, sequentially outputs a horizontal scanning pulse to the column signal processing circuit 5, sequentially selects each of the column signal processing circuits 5, and causes each of the column signal processing circuits 5 to output a pixel signal subjected to signal processing to a horizontal signal line 12.

The output circuit 7 performs signal processing on the pixel signals sequentially supplied from each of the column signal processing circuits 5 through the horizontal signal line 12, and outputs the pixel signals. As the signal processing, buffering, black level adjustment, column variation correction, and various types of digital signal processing can be employed, for example. As the black level adjustment, for example, processing of correcting a black level of a pixel signal to "0" by subtracting a reference signal of an optical black level obtained from the pixel 9 (light shielding pixel 9) in an OPB pixel region 18 from a pixel signal obtained from the pixel 9 (effective pixel 9) in an effective pixel region 17 can be employed.

The control circuit 8 generates, on the basis of a vertical synchronization signal, a horizontal synchronization signal, and a master clock signal, a clock signal or a control signal in accordance with which the vertical drive circuit 4, the column signal processing circuit 5, the horizontal drive circuit 6, and the like operate. Then, the control circuit 8 outputs the clock signal or control signal thus generated to the vertical drive circuit 4, the column signal processing circuit 5, the horizontal drive circuit 6, and the like.

[1-2 Configuration of Main Part]

Next, a detailed structure of the solid-state imaging device 1 is described.

Figure 2A:
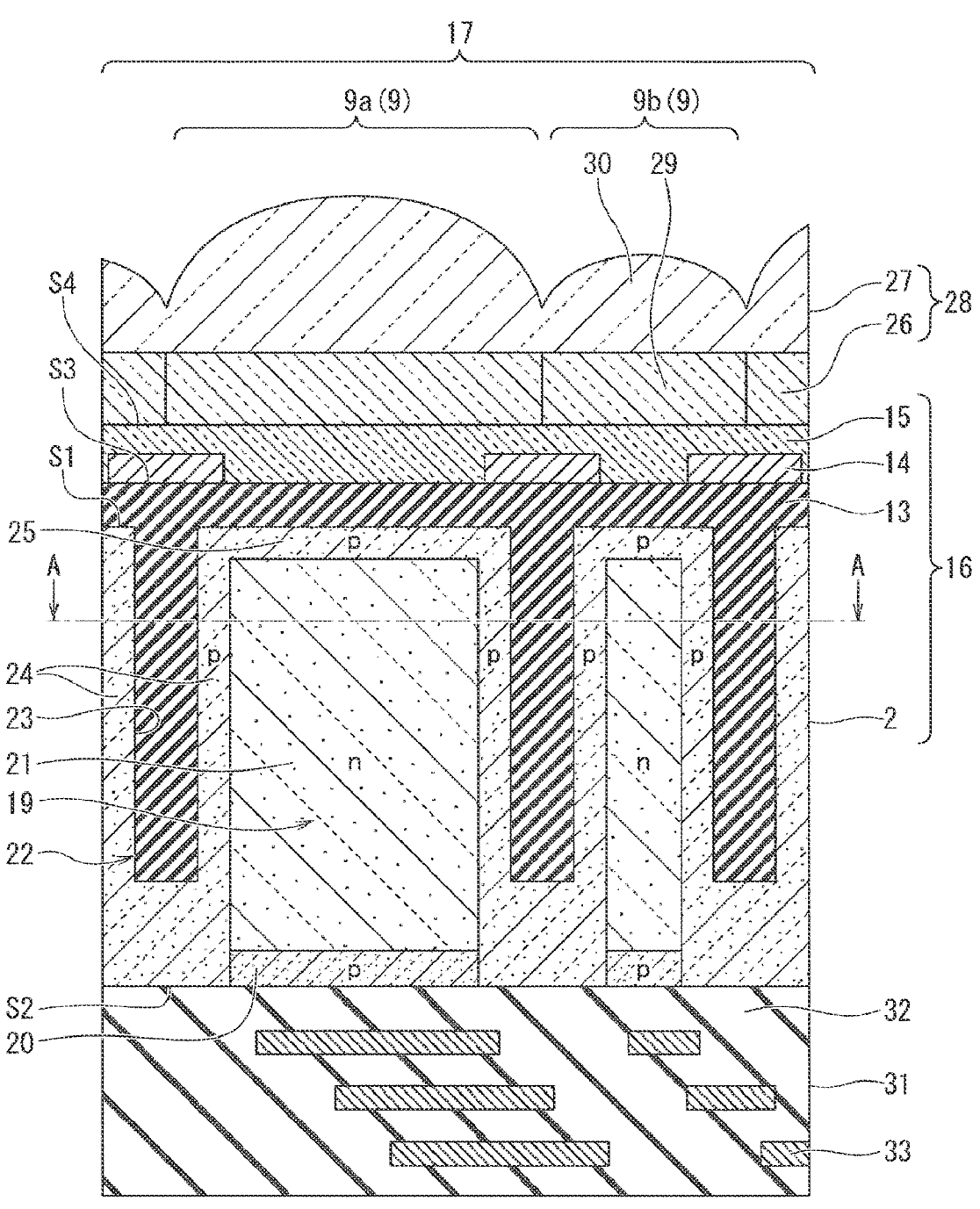
FIG. 2A is a diagram illustrating a cross-sectional configuration of an effective pixel region.
Figure 2B:
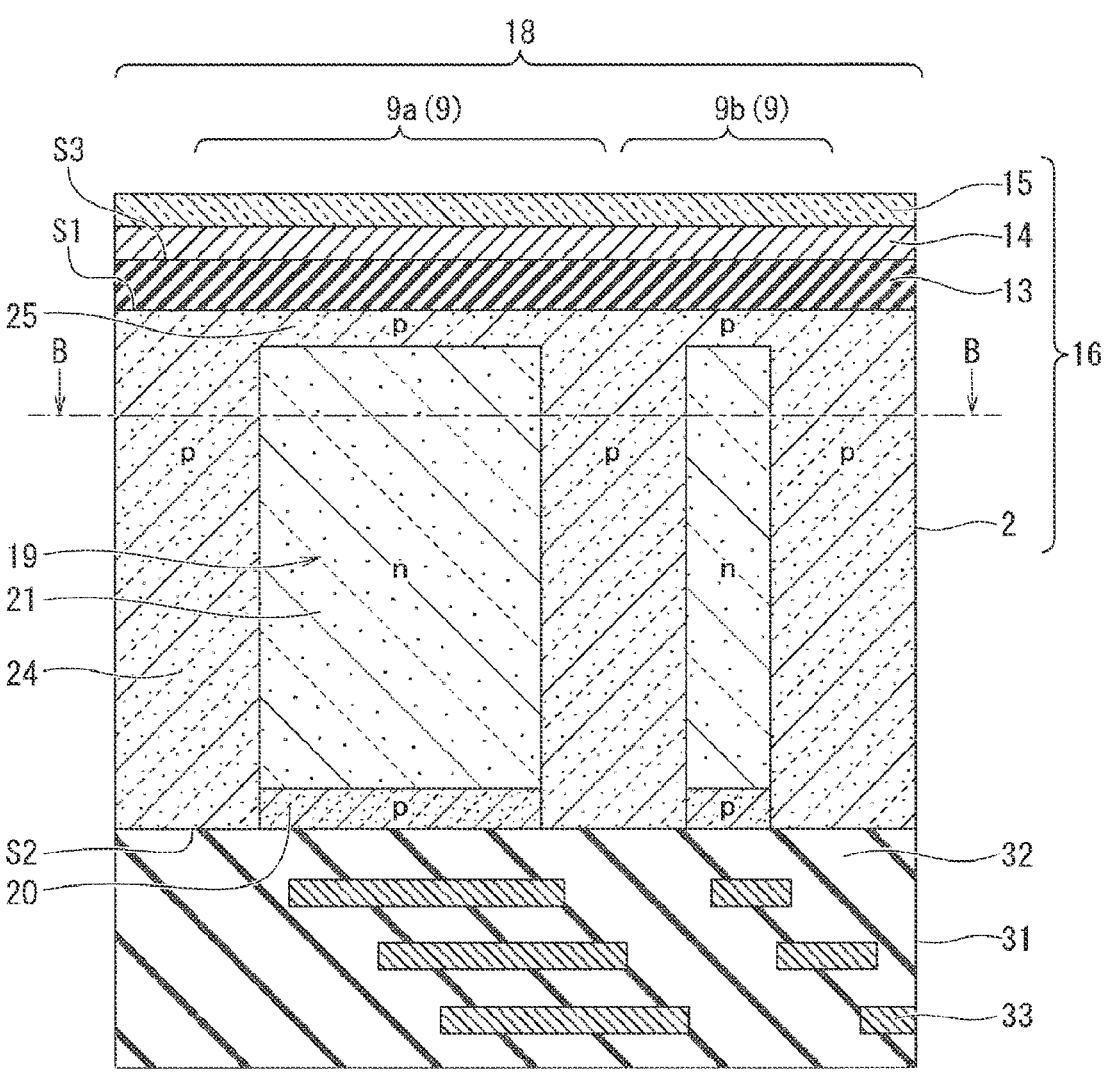
FIG. 2B is a diagram illustrating a cross-sectional configuration of an OPB pixel region.
Figure 3A:
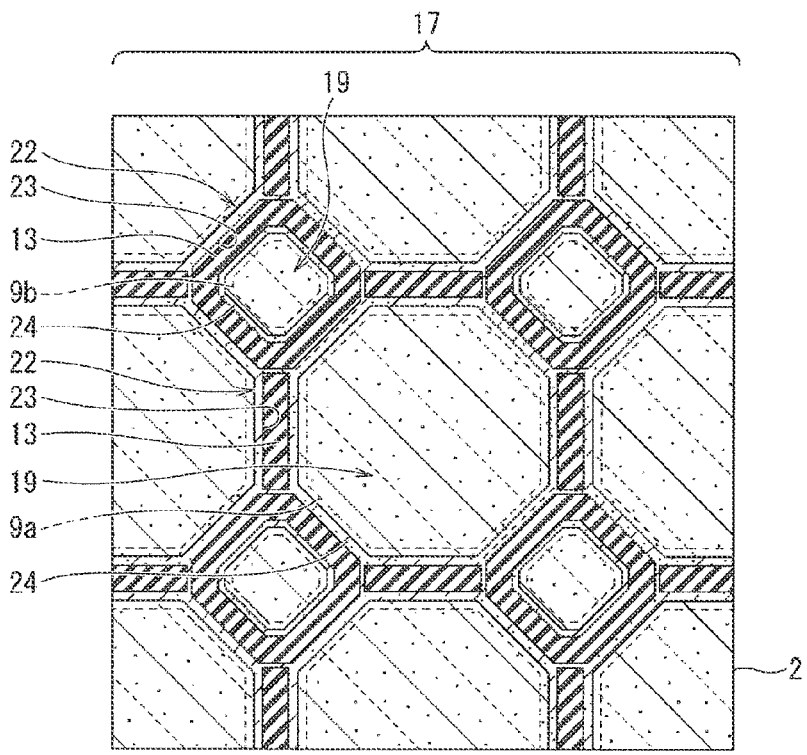
FIG. 3A is a diagram illustrating a planar configuration of the effective pixel region in a case of being cut along an A-A line in FIG. 2A.
Figure 3B:
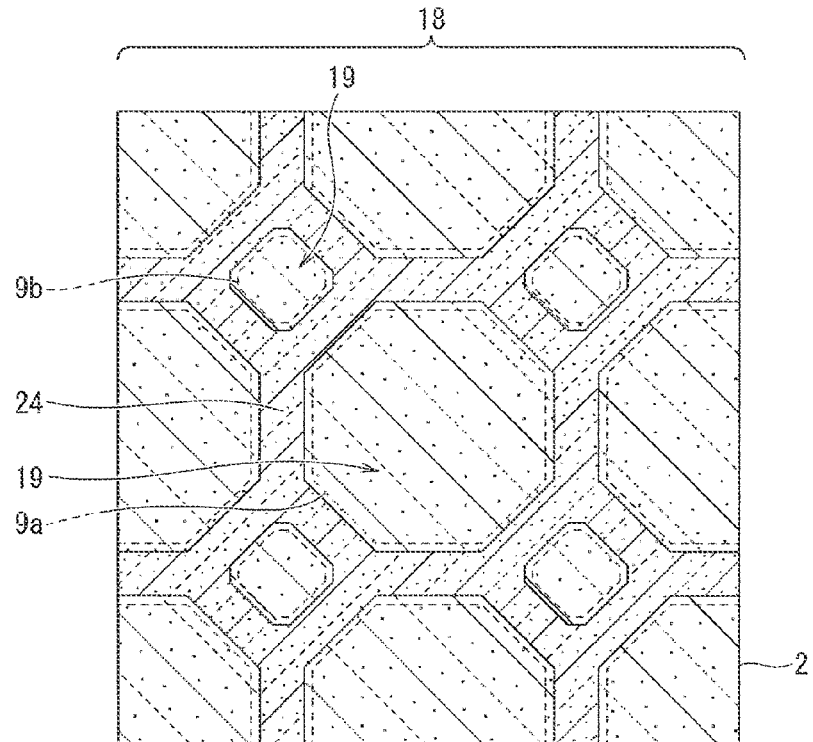
FIG. 3B is a diagram illustrating a planar configuration of the OPB pixel region in a case of being cut along a B-B line in FIG. 2B.

FIG. 2A is a diagram illustrating a cross-sectional configuration of the effective pixel region 17 of the solid-state imaging device 1, and FIG. 2B is a diagram illustrating a cross-sectional configuration of the OPB pixel region 18 of the solid-state imaging device 1. Further, FIG. 3A is a diagram illustrating a planar configuration of the effective pixel region 17 in a case of being cut along an A-A line in FIG. 2A, and FIG. 3B is a diagram illustrating a planar configuration of the OPB pixel region 18 in a case of being cut along a B-B line in FIG. 2B.

As illustrated in FIGS. 2A and 2B, the solid-state imaging device 1 includes a light receiving layer 16 formed by layering the substrate 2, an insulating film 13, a light shielding film 14, and a planarization film 15 in this order.

The substrate 2 includes a semiconductor substrate containing, e.g., silicon (Si), and is formed with the pixel region 3. As illustrated in FIG. 1, the pixel region 3 is divided into the effective pixel region 17 and the optical black (OPB) pixel region 18. The effective pixel region 17 is a region where pixels 9 (hereinafter also referred to as "effective pixels 9") including photoelectric conversion units 19 of which the light incident surface side is not shielded by the light shielding film 14 are arrayed. That is, the effective pixel region 17 is a region where the pixels 9 (effective pixels 9) for obtaining pixel signals in accordance with incident light are formed. Further, the OPB pixel region 18 is a region adjacent to the effective pixel region 17, where pixels 9 (hereinafter also referred to as "light shielding pixels 9") including photoelectric conversion units 19 of which the light incident surface side is shielded by the light shielding film 14 are arrayed. FIG. 1 illustrates, as an example, a case where the effective pixel region 17 is located at a central part of the pixel region 3 and the OPB pixel region 18 is located at a peripheral edge part of the pixel region 3.

Further, the OPB pixel region 18 includes specific regions (hereinafter also referred to as a "VOPB pixel region 18a", a "VOPB pixel region 18b", an "HOPB pixel region 18c", and an "HOPB pixel region 18d") where pixels 9 (light shielding pixels 9) for obtaining pixel signals (hereinafter also referred to as a "reference signal") of the optical black level are formed. As an example, FIG. 1 illustrates a case where, in plan view, in the OPB pixel region 18, the VOPB pixel region 18a is located on the upper side of the effective pixel region 17, the VOPB pixel region 18b is located on the lower side, the HOPB pixel region 18c is located on the left side, and the HOPB pixel region 18d is located on the right side.

Further, in the pixel region 3 (effective pixel region 17, OPB pixel region 18), two types of pixels 9 (hereinafter also referred to as a "large pixel 9a" and a "small pixel 9b") having different pixel sizes are arrayed as the pixels 9. As illustrated in FIGS. 3A and 3B, the large pixels 9a have an octagonal planar shape in which four corners of a square are chamfered, and are arrayed in a row direction and a column direction of the pixel region 3 (effective pixel region 17, OPB pixel region 18). Further, the small pixels 9b are formed with a pixel size (planar size) smaller than that of the large pixel 9a in gaps at four corners of the large pixel 9a. The small pixels 9b have an octagonal planar shape rotated 45 degrees from the large pixel 9a, and are arrayed in the row direction and the column direction of the pixel region 3 (effective pixel region 17, OPB pixel region 18). Further, among the two types of pixels 9 (large pixel 9a, small pixel 9b), the pixel 9 (small pixel 9b) having a smaller pixel size is a low-sensitivity pixel having a lower light sensitivity than that of the pixel 9 (large pixel 9a) having a larger pixel size. With this configuration, in the effective pixel region 17, a wide dynamic range can be achieved by combining a pixel signal obtained from the large pixel 9a and a pixel signal obtained from the small pixel 9b.

The photoelectric conversion unit 19 included in the pixel 9 (large pixel 9a, small pixel 9b) includes a p-type semiconductor region 20 formed on the front surface S2 side of the substrate 2 and an n-type semiconductor region 21 formed on the back surface S1 side (light incident surface side) with respect to the p-type semiconductor region 20. In the photoelectric conversion unit 19, a pn junction between the p-type semiconductor region 20 and the n-type semiconductor region 21 constitutes a photodiode. As a result, each of the photoelectric conversion units 19 generates a signal charge corresponding to an amount of incident light on the photoelectric conversion unit 19, and accumulates the generated signal charge in the n-type semiconductor region 21.

Further, as illustrated in FIGS. 2A and 3A, a pixel isolation unit 22 is formed between adjacent photoelectric conversion units 19 in the effective pixel region 17. The pixel isolation unit 22 has a trench part 23 ("dug structure" in a broad sense) dug in a region between the photoelectric conversion units 19 of adjacent pixels 9 in a region in the substrate 2. The trench part 23 is dug in the region in the substrate 2 so as to surround each of the photoelectric conversion units 19 of all the pixels 9 (large pixel 9a, small pixel 9b). FIG. 2A illustrates, as an example, a case where the trench part 23 is dug from the back surface S1 side (light incident surface side) of the substrate 2 to the vicinity of the front surface S2. As a method of digging the trench part 23, for example, dry etching such as RIE can be employed.

Further, an insulating film 13 is embedded in the trench part 23. In addition, a metal film for reflecting incident light may be embedded in the insulating film 13. With this configuration, each pixel 9 in the effective pixel region 17 can be shielded by the pixel isolation unit 22, optical color mixing can be reduced, and the quality of an obtained image can be further improved.

Note that in the first embodiment, the example has been described, where the trench part 23 is dug from the back surface S1 side (light incident surface side) of the substrate 2 to the vicinity of the front surface S2. However, other configurations may be employed. For example, it may be configured such that the trench part 23 penetrates the substrate 2 from the back surface S1 side (light incident surface side) to the front surface S2. Alternatively, for example, it may be configured such that the trench part 23 is dug from the front surface S2 side of the substrate 2 to the vicinity of the front surface S2, or it may be configured such that the trench part 23 penetrates the substrate 2 from the front surface S2 side to the front surface S2.

Here, as illustrated in FIGS. 2B and 3B, the pixel isolation unit 22 (trench part 23) is not formed between the photoelectric conversion units 19 of the pixels 9 in the OPB pixel region 18. That is, the trench part 23 is dug only in a region between the photoelectric conversion units 19 of the pixels 9 in the effective pixel region 17 in the region in the substrate 2. In other words, it can be said that in plan view, the percentage of an area occupied by the trench part 23 (dug structure) in the OPB pixel region 18 is smaller than the percentage of an area occupied by the trench part 23 (dug structure) in the effective pixel region 17. Examples of the area in the OPB pixel region 18 and the area in the effective pixel region 17 in plan view include, for example, an area in the OPB pixel region 18 and an area in the effective pixel region 17 in a case where the substrate 2 is viewed from an on-chip lens 30 side. Further, examples of the area of the trench part 23 (dug structure) in plan view include, for example, the opening area of the dug structure (trench part 23) in a case where the substrate 2 is viewed from the on-chip lens 30 side. FIGS. 2B and 3B illustrate, as an example, a case where the trench part 23 (dug structure) in the OPB pixel region 18 is omitted and the percentage of the area occupied by the trench part 23 (dug structure) in the OPB pixel region 18 is zero.

Further, in the effective pixel region 17, in a region between the photoelectric conversion unit 19 and the pixel isolation unit 22, i.e., a region adjacent to the pixel isolation unit 22 (trench part 23) in the substrate 2, a p-type semiconductor region 24 is formed so as to surround each photoelectric conversion unit 19. In addition, in a region surrounded on the back surface S1 side (light incident surface side) of the substrate 2 by the p-type semiconductor region 24, a p-type semiconductor region 25 is formed so as to cover the light incident surface side of each photoelectric conversion unit 19. The p-type semiconductor regions 24, 25 are impurity regions doped with p-type impurities. As the p-type impurity, for example, at least one of boron (B) or difluoroboron ($BF_2$) can be employed. Further, the p-type semiconductor regions 24, 25 are also formed in the OPB pixel region 18. The p-type semiconductor region 24 in the OPB pixel region 18 is formed in a region of the substrate 2 between adjacent photoelectric conversion units 19.

Here, in the effective pixel region 17, in a region adjacent to the trench part 23 in the substrate 2, electrons are generated and a dark current is generated due to damage (defect) caused by dry etching at the time of forming the trench part 23. On the other hand, in the first embodiment, the p-type semiconductor region 24 adjacent to the trench part 23 in the substrate 2 can absorb, by holes thereof, electrons generated due to damage (defect) of the substrate 2 by dry etching, and can reduce a dark current.

Note that since the trench part 23 is not dug in the OPB pixel region 18, no damage (defect) of the substrate 2 due to dry etching at the time of forming the trench part 23 is caused, no electrons are generated due to the damage (defect) of the substrate 2, and a dark current can be reduced.

The insulating film 13 continuously covers the entire back surface S1 side (light incident surface side) of the substrate 2 and the inside of the trench part 23. Further, the light shielding film 14 covers part of the back surface S3 (light incident surface) of the insulating film 13. Specifically, the effective pixel region 17 is formed in such a grid shape that the light incident surface side of each of the plurality of photoelectric conversion units 19 is opened, and incident light can reach the photoelectric conversion unit 19. Further, in the OPB pixel region 18, there are no openings corresponding to the photoelectric conversion units 19, and light is completely shielded. In addition, the planarization film 15 continuously covers the entire back surface S3 side (light incident surface side) of the insulating film 13 including the light shielding film 14 such that the back surface S4 (light incident surface) of the light receiving layer 16 is a flat surface.

Further, in the effective pixel region 17, a light condensing layer 28 in which a color filter layer 26 and an on-chip lens layer 27 are layered in this order is formed on the back surface S4 side (light incident surface side) of the light receiving layer 16. The color filter layer 26 includes a plurality of color filters 29 disposed corresponding to the respective pixels 9. With this configuration, each color filter 29 transmits light with a specific wavelength, and causes the transmitted light to enter the photoelectric conversion unit 19. Further, the on-chip lens layer 27 includes a plurality of on-chip lenses 30 disposed corresponding to the respective pixels 9. With this configuration, each on-chip lens 30 condenses incident light into the photoelectric conversion unit 19.

Further, a wiring layer 31 is formed on the front surface S2 side of the light receiving layer 16. The wiring layer 31 has an interlayer insulating film 32 and a wiring 33 stacked via the interlayer insulating film 32. Further, the wiring layer 31 drives a pixel transistor constituting each pixel 9 via the wiring 33.

As described above, in the solid-state imaging device 1 according to the first embodiment, in plan view, the percentage of the area occupied by the dug structure (trench part 23) in the OPB pixel region 18 is smaller than the percentage of the area occupied by the dug structure (trench part 23) in the effective pixel region 17. With this configuration, in the effective pixel region 17, the holes in the p-type semiconductor region can absorb electrons generated due to damage (defect) of the substrate 2 by formation of the dug structure (trench part 23), and can reduce a dark current. Further, in the OPB pixel region 18, damage (defect) itself of the substrate 2 due to formation of the dug structure (trench part 23) can be reduced, electrons generated due to the damage (defect) of the substrate 2 can be reduced, and a dark current can be reduced. Thus, it is possible to reduce both the dark current in the effective pixel region 17 and the dark current in the OPB pixel region 18 and to reduce a difference therebetween, and it is possible to provide the solid-state imaging device 1 capable of obtaining an image with a higher image quality.

Here, the dark current increases as the dug structure (trench part 23) is deeper. However, the present inventors have found that the size of the area (opening area) of the dug structure (trench part 23) in plan view, i.e., in a case where the substrate 2 is viewed from the on-chip lens 30 side accounts for most of influence on the dark current. Then, based on this finding, the present inventors have considered defining the configuration of the solid-state imaging device 1 by the area of the dug structure (trench part 23) in plan view.

[1-3 Modifications]

Figure 4:
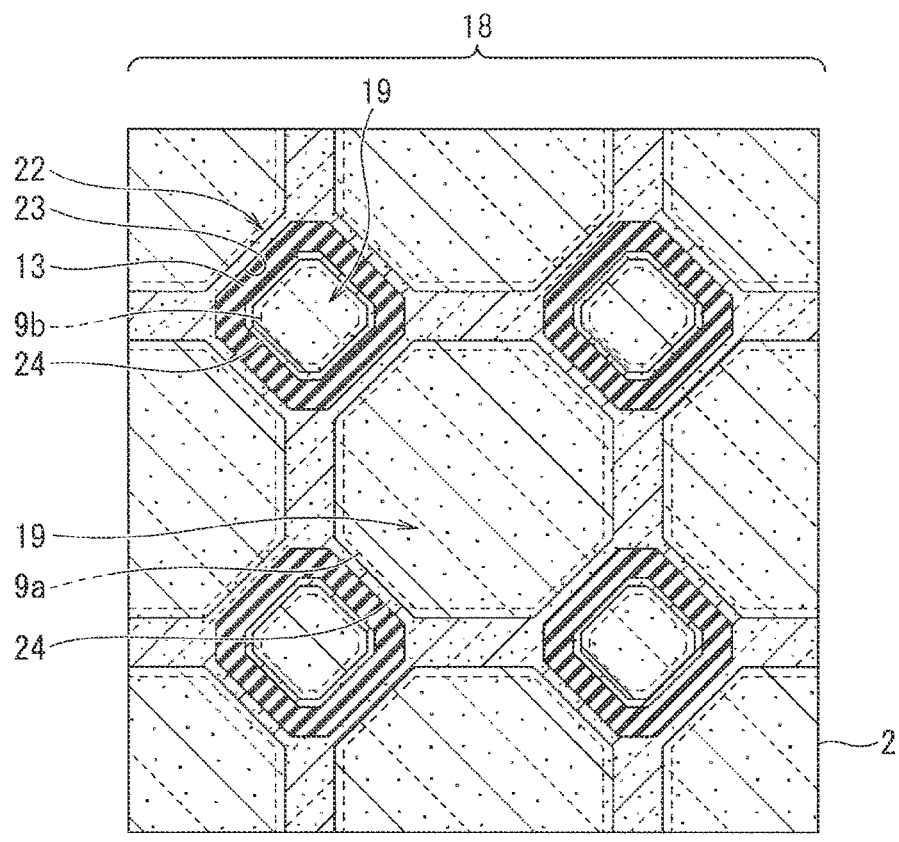
FIG. 4 is a diagram illustrating a planar configuration of an OPB pixel region according to a modification.

(1) Note that in the first embodiment, the example where the trench part 23 (dug structure) is dug only in the effective pixel region 17 and is not dug in the OPB pixel region 18 has been described; however, other configurations can be employed. For example, it may be configured such that the trench part 23 is also dug in the OPB pixel region 18. In a case where the trench part 23 (dug structure) is also dug in the OPB pixel region 18, it may be configured such that in the OPB pixel region 18, the trench part 23 (dug structure) is dug in a region in the substrate 2 so as to surround only the photoelectric conversion unit 19 of one of the two types of pixels 9 (large pixel 9a, small pixel 9b), as illustrated in, e.g., FIG. 4. FIG. 4 illustrates, as an example, a case where the trench part 23 (dug structure) in the OPB pixel region 18 is dug in the region in the substrate 2 so as to surround the photoelectric conversion unit 19 of the pixel 9 (small pixel 9b) having a smaller pixel size among the two types of pixels 9 (large pixel 9a, small pixel 9b).

The OPB pixel region 18 in which the trench part 23 (dug structure) is dug may be the entire OPB pixel region 18 or only part thereof (for example, all or part of a specific region in the OPB pixel region 18, all or part of the OPB pixel region 18 other than a specific region, or a combination thereof). Note that in a case where the presence or absence of the trench part 23 (dug structure) and the pattern of the trench part 23 (dug structure) are different between the specific region and the region other than the specific region in the OPB pixel region 18, it is preferable that in plan view, the percentage of an area occupied by the trench part 23 (dug structure) in the specific region in the OPB pixel region 18 is smaller than the percentage of an area occupied by the trench part 23 (dug structure) in the effective pixel region 17.

Here, for example, as in the first embodiment, in a case where the trench part 23 (dug structure) is dug only in the effective pixel region 17 and the p-type semiconductor region 24 is provided in the region of the substrate 2 adjacent to the trench part 23 (dug structure), most of electrons (hereinafter also referred to as "damage electrons") generated due to damage (defect) of the substrate 2 by formation of the trench part 23 (dug structure) can be absorbed, in the effective pixel region 17, by the holes of the p-type semiconductor region, but it is difficult to completely eliminate all the damage electrons. Further, since the trench part 23 (dug structure) is not dug in the OPB pixel region 18, damage electrons are not generated and are zero. Thus, there is a probability that a dark current in the OPB pixel region 18 is smaller than a dark current in the effective pixel region 17 and a difference between the dark current in the OPB pixel region 18 and the dark current in the effective pixel region 17 is not zero. On the other hand, for example, in a case where the trench part 23 (dug structure) is dug also in part of the specific region in the OPB pixel region 18 as in the present modification, damage electrons in the OPB pixel region 18 are not zero. Thus, the difference between the dark current in the OPB pixel region 18 and the dark current in the effective pixel region 17 can be close to zero.

Figure 5A:
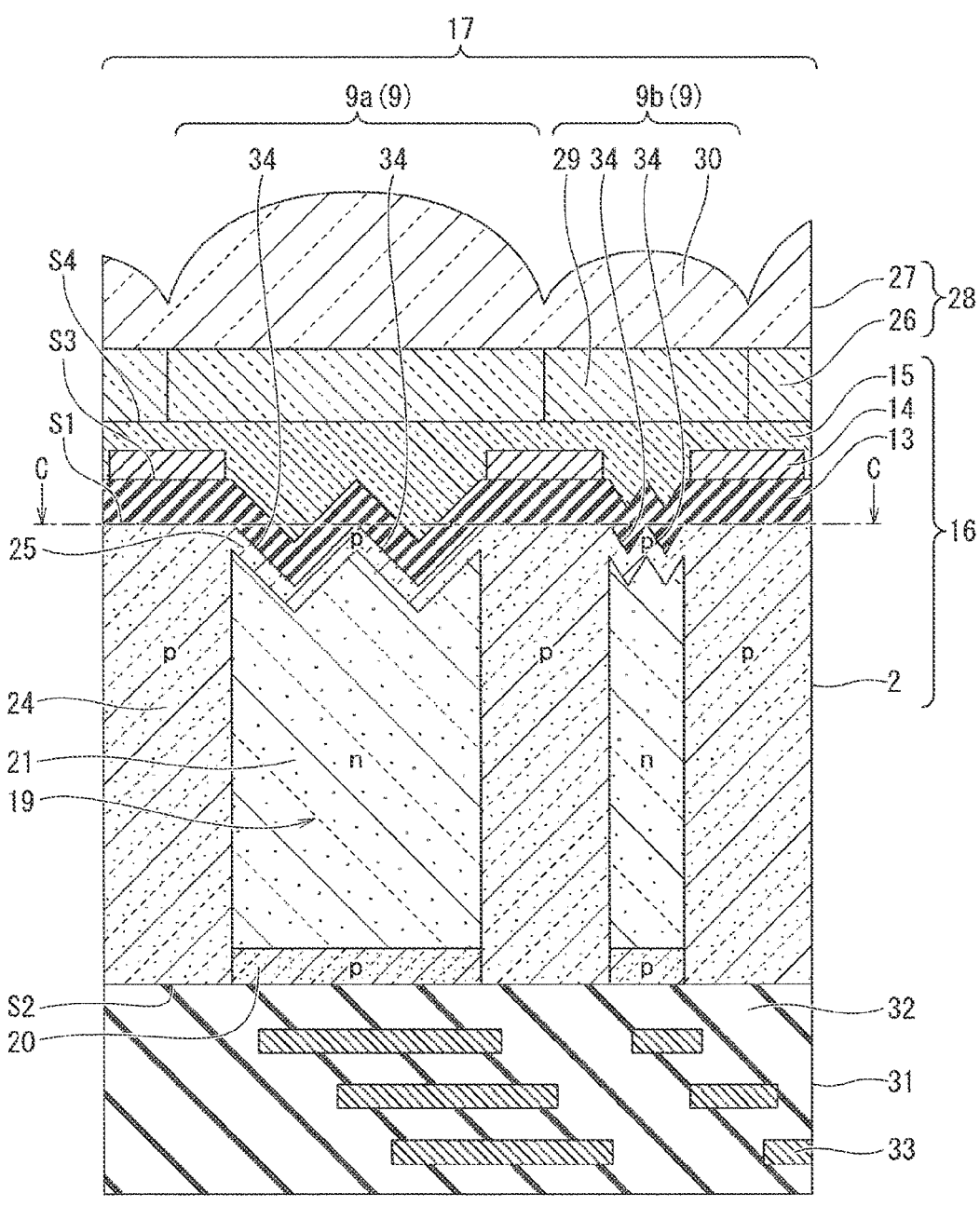
FIG. 5A is a diagram illustrating a cross-sectional configuration of an effective pixel region according to a modification.
Figure 5B:
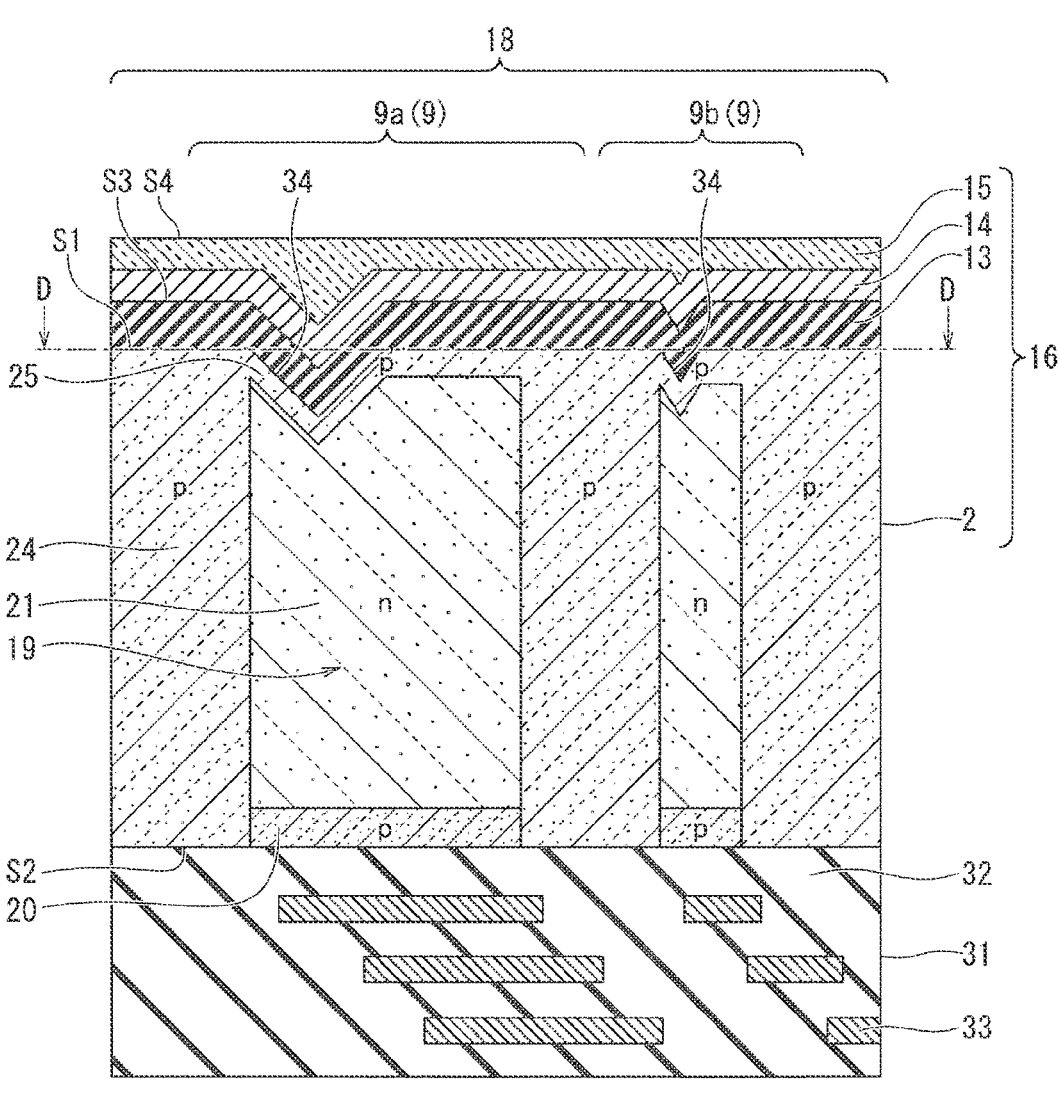
FIG. 5B is a diagram illustrating a cross-sectional configuration of an OPB pixel region according to the modification.
Figure 6A:
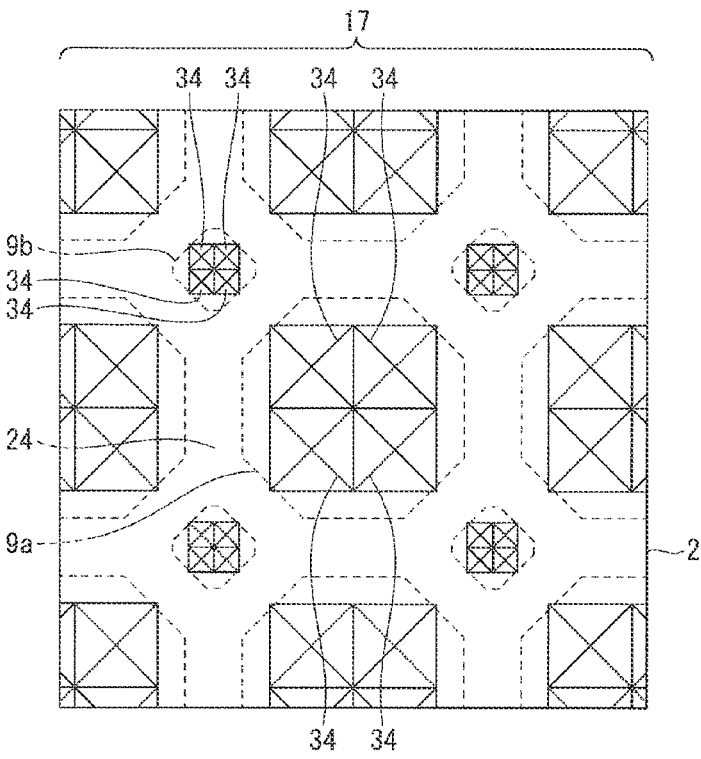
FIG. 6A is a diagram illustrating a planar configuration of the effective pixel region in a case of being cut along a C-C line in FIG. 5A.
Figure 6B:
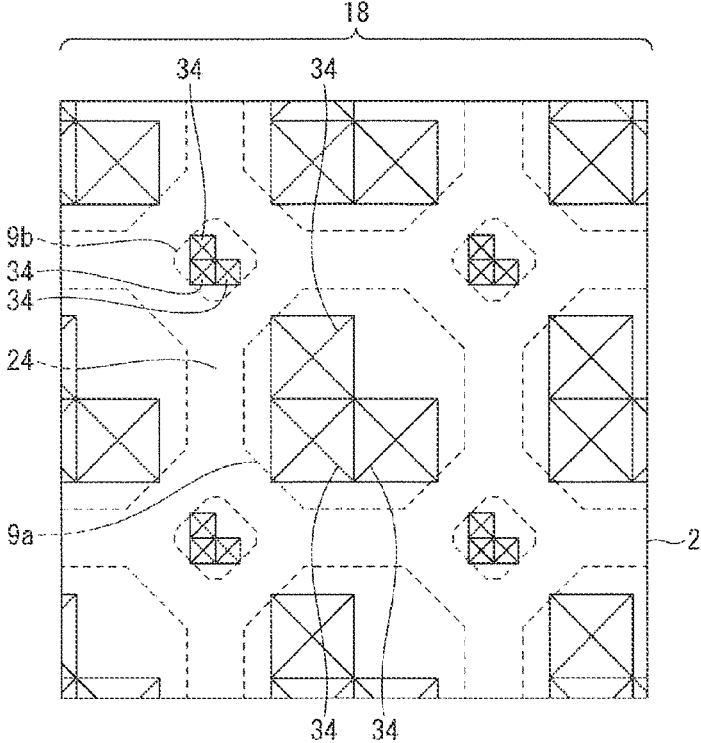
FIG. 6B is a diagram illustrating a planar configuration of the OPB pixel region in a case of being cut along a D-D line in FIG. 5B.

(2) Further, although the first embodiment has described the example where the trench part 23 is used as the dug structure, other configurations can also be employed. For example, as illustrated in FIGS. 5A, 5B, 6A, and 6B, a plurality of recesses 34 dug in the back surface S1 (light incident surface) of the substrate 2 may be used such that incident light is scattered. FIG. 5A is a diagram illustrating a cross-sectional configuration of the effective pixel region 17, and FIG. 5B is a diagram illustrating a cross-sectional configuration of the OPB pixel region 18. Further, FIG. 6A is a diagram illustrating a planar configuration of the effective pixel region 17 in a case of being cut along a C-C line in FIG. 5A, and FIG. 6B is a diagram illustrating a planar configuration of the OPB pixel region 18 in a case of being cut along a D-D line in FIG. 5B. In FIGS. 6A and 6B, the light shielding film 14 is omitted such that the recesses 34 are clearly recognized. As the recess 34, for example, a conical recess, a frustum recess, or a backside scattering technology (BST) pattern can be employed. As the BST pattern, for example, various patterns that scatter incident light can be employed. Specific examples thereof include a pattern in which a plurality of vertical holes is arrayed in a two-dimensional matrix shape and a pattern in which a plurality of groove portions is arrayed radially, and the like. FIGS. 5A, 5B, 6A, and 6B illustrate, as an example, a case where a quadrangular pyramid recess is used as the recess 34. With this configuration, the recesses 34 can scatter incident light on inclined surfaces thereof in the effective pixel region 17, can advance the incident light in an oblique direction, can extend an optical path length in the photoelectric conversion unit 19, and can improve a quantum efficiency QE.

In a case where the recess 34 is used as the dug structure, in plan view, the percentage of an area occupied by the recesses 34 (dug structure) in the OPB pixel region 18 is smaller than the percentage of an area occupied by the recesses 34 (dug structure) in the effective pixel region 17. FIGS. 5A, 5B, 6A, and 6B illustrate, as an example, a case where four recesses 34 are formed for one pixel 9 in the effective pixel region 17 and three recesses 34 are formed for one pixel 9 in the OPB pixel region 18.

Further, in the case where the recess 34 is used as the dug structure, the p-type semiconductor region 25 is a p-type semiconductor region formed in a region adjacent to the pixel isolation unit 22 (recess 34) in the substrate 2. Thus, in the present modification, the p-type semiconductor region 25 can absorb, by holes thereof, electrons generated due to damage (defect) of the substrate 2 by formation of the recess 34.

As described above, in the present modification, in plan view, the percentage of the area occupied by the dug structure (recesses 34) in the OPB pixel region 18 is smaller than the percentage of the area occupied by the dug structure (recesses 34) in the effective pixel region 17. Thus, in the effective pixel region 17, the holes in the p-type semiconductor region 25 can absorb electrons generated due to damage (defect) of the substrate 2 by formation of the dug structure (recesses 34), and can reduce a dark current. Further, in the OPB pixel region 18, damage (defect) itself of the substrate 2 due to formation of the dug structure (recesses 34) can be reduced, electrons generated due to the damage (defect) of the substrate 2 can be reduced, and a dark current can be reduced.

Note that in a case where both the trench part 23 and the recess 34 are used as the dug structure, in plan view, the percentage of an area occupied by the trench part 23 and the recesses 34 (dug structure) in the OPB pixel region 18 is smaller than the percentage of an area occupied by the trench part 23 and the recesses 34 (dug structure) in the effective pixel region 17. Further, in a case where the presence or absence of the dug structure and the pattern of the dug structure are different between the specific region (VOPB pixel regions 18a, 18b, HOPB pixel regions 18c, 18d) and the region other than the specific region in the OPB pixel region 18, it is preferable that in plan view, the percentage of an area occupied by the dug structure in the specific region is smaller than the percentage of an area occupied by the dug structure in the effective pixel region 17.

2. Second Embodiment: Example of Application to Electronic Device

[2-1 Imaging Device]

The technology according to the present disclosure (present technology) may be applied to various electronic devices.

FIG. 7 is a diagram illustrating an example of a schematic configuration of an imaging device (e.g., video camera or digital still camera) as the electronic device to which the present disclosure is applied.

As illustrated in FIG. 7, the imaging device 1000 includes a lens group 1001, a solid-state imaging device 1002 (solid-state imaging device 1 according to the first embodiment, solid-state imaging device 1 according to the modification), a digital signal processor (DSP) circuit 1003, a frame memory 1004, a monitor 1005, and a memory 1006. The DSP circuit 1003, the frame memory 1004, the monitor 1005, and the memory 1006 are connected to one another via a bus line 1007.

The lens group 1001 guides incident light (image light) from a subject to the solid-state imaging device 1002 to form an image on a light receiving surface (pixel region) of the solid-state imaging device 1002.

The solid-state imaging device 1002 includes the CMOS image sensor of the first embodiment described above. The solid-state imaging device 1002 converts an amount of incident light forming an image on the light receiving surface by the lens group 1001 into an electrical signal on a pixel basis, and supplies the electrical signal as a pixel signal to the DSP circuit 1003.

The DSP circuit 1003 performs predetermined signal processing on a pixel signal supplied from the solid-state imaging device 1002. Then, the DSP circuit 1003 supplies the image signal subjected to the image processing to the frame memory 1004 on a frame basis, and temporarily stores the image signal in the frame memory 1004.

The monitor 1005 includes, for example, a panel display device such as a liquid crystal panel or an organic electro luminescence (EL) panel. The monitor 1005 displays an image (moving image) of the subject on the basis of the pixel signal temporarily stored in the frame memory 1004 on a frame basis.

The memory 1006 includes a DVD, a flash memory, and the like. The memory 1006 reads and records the pixel signal temporarily stored in the frame memory 1004 on a frame basis.

Meanwhile, the present technology may also have a following configuration.

(1)

A solid-state imaging device including a substrate, a pixel region formed on the substrate and configured such that a plurality of pixels is arrayed therein, a dug structure formed in the pixel region, and

11 a p-type semiconductor region formed in a region adjacent to the dug structure in the substrate, in which the pixel region is divided into an effective pixel region where effective pixels including photoelectric conversion units not shielded from light are arrayed and an OPB pixel region formed adjacent to the effective pixel region and configured such that light shielding pixels including photoelectric conversion units shielded from light are arrayed therein, and in plan view, the percentage of an area occupied by the dug structure in the OPB pixel region is smaller than the percentage of an area occupied by the dug structure in the effective pixel region.

(2)

The solid-state imaging device according to (1), in which in plan view, the percentage of an area occupied by the dug structure in a specific region, where the light shielding pixels are arrayed in order to obtain a reference signal of an optical black level, in the OPB pixel region is smaller than the percentage of an area occupied by the dug structure in the effective pixel region.

(3)

The solid-state imaging device according to (1) or (2), in which the dug structure includes a trench part dug in a region between the photoelectric conversion units of adjacent ones of the pixels in the region in the substrate.

(4)

The solid-state imaging device according to (3), in which the pixels include two types of pixels having different pixel sizes, the trench part in the effective pixel region is dug in the region in the substrate so as to surround each of the photoelectric conversion units of all the pixels, and the trench part in the OPB pixel region is dug in the region in the substrate so as to surround only a photoelectric conversion unit of one of the two types of pixels.

(5)

The solid-state imaging device according to (4), in which the trench part in the OPB pixel region is dug in the region in the substrate so as to surround a photoelectric conversion unit of a pixel having a smaller pixel size among the two types of pixels.

(6)

The solid-state imaging device according to (4) or (5), in which among the two types of pixels, a pixel having a smaller pixel size is a low-sensitivity pixel having a lower light sensitivity than that of a pixel having a larger pixel size.

(7)

The solid-state imaging device according to (3), in which the trench part is dug only in a region between the photoelectric conversion units of the pixels in the effective pixel region in the region in the substrate.

(8)

The solid-state imaging device according to (1) or (2), in which the dug structure includes a plurality of recesses dug in toward a light incident surface side of the substrate such that incident light is scattered.

(9)

The solid-state imaging device according to any one of (1) to (8), in which the p-type semiconductor region is a region doped with at least one of boron or difluoroboron.

(10)

An electronic device including

12 a solid-state imaging device having a substrate, a pixel region formed on the substrate and configured such that a plurality of pixels is arrayed therein, a dug structure formed in the pixel region, and a p-type semiconductor region formed in a region adjacent to the dug structure in the substrate, in which the pixel region is divided into an effective pixel region where effective pixels including photoelectric conversion units not shielded from light are arrayed and an OPB pixel region formed adjacent to the effective pixel region and configured such that light shielding pixels including photoelectric conversion units shielded from light are arrayed therein, and in plan view, the percentage of an area occupied by the dug structure in the OPB pixel region is smaller than the percentage of an area occupied by the dug structure in the effective pixel region.

REFERENCE SIGNS LIST

1 Solid-state imaging device
2 Substrate
3 Pixel region
4 Vertical drive circuit
5 Column signal processing circuit
6 Horizontal drive circuit
7 Output circuit
8 Control circuit
9 Pixel, Light shielding pixel, Effective pixel
9a Large pixel
9b Small pixel
10 Pixel drive wiring
11 Vertical signal line
12 Horizontal signal line
13 Insulating film
14 Light shielding film
15 Planarization film
16 Light receiving layer
17 Effective pixel region
18 OPB pixel region
18a VOPB pixel region
18b VOPB pixel region
18c HOPB pixel region
18d HOPB pixel region
19 Photoelectric conversion unit
20 p-type semiconductor region
21 n-type semiconductor region
22 Pixel isolation unit
23 Trench part
24, 25 p-type semiconductor region
26 Color filter layer
27 On-chip lens layer
28 Light condensing layer
29 Color filter
30 On-chip lens
31 Wiring layer
32 Interlayer insulating film
33 Wiring
34 Recess
1000 Imaging device
1001 Lens group
1002 Solid-state imaging device
1003 DSP circuit
1004 Frame memory
1005 Monitor
1006 Memory
1007 Bus line
The invention claimed is:

1. A solid-state imaging device, comprising:
a substrate;
a pixel region on the substrate, wherein
the pixel region includes an array of a plurality of pixels,
the plurality of pixels includes a plurality of photoelectric conversion units,
a first pixel of the plurality of pixels includes a first photoelectric conversion unit of the plurality of photoelectric conversion units,
a second pixel of the plurality of pixels includes a second photoelectric conversion unit of the plurality of photoelectric conversion units,
the first pixel is adjacent to the second pixel,
the plurality of photoelectric conversion units includes a first plurality of photoelectric conversion units that is not shielded from light, and a second plurality of photoelectric conversion units that is shielded from the light,
the plurality of pixels includes a set of effective pixels and a set of light shielding pixels,
each of the set of effective pixels and the set of light shielding pixels includes a first type of pixels and a second type of pixels, and
a size of the first type of pixels is different from a size of the second type of pixels;
a dug structure in the pixel region, wherein the dug structure includes a trench part in a region between the first photoelectric conversion unit of the first pixel and the second photoelectric conversion unit of the second pixel; and
a p-type semiconductor region in a region adjacent to the dug structure in the substrate, wherein
the pixel region further includes an effective pixel region and an optical black (OPB) pixel region,
the effective pixel region includes the set of effective pixels that includes the first plurality of photoelectric conversion units,
a first portion of the trench part is in the effective pixel region,
the first portion of the trench part surrounds each of the first plurality of photoelectric conversion units,
the OPB pixel region is adjacent to the effective pixel region,
the OPB pixel region includes the set of light shielding pixels that includes the second plurality of photoelectric conversion units,
a second portion of the trench part is in the OPB pixel region,
the second portion of the trench part surrounds only a specific photoelectric conversion unit of the second plurality of photoelectric conversion units,
one of the first type of pixels of the set of light shielding pixels or the second type of pixels of the set of light shielding pixels includes the specific photoelectric conversion unit, and
in a plan view, a percentage of an area of the second portion of the trench part in the OPB pixel region is smaller than a percentage of an area of the first portion of the trench part in the effective pixel region.
2. The solid-state imaging device according to claim 1, wherein
in the plan view, a percentage of an area of the second portion of the trench part in a specific region of the OPB pixel region is smaller than the percentage of the area of the first portion of the trench part in the effective pixel region, and
the set of light shielding pixels, in the specific region, is configured to obtain a reference signal of an optical black level.
3. The solid-state imaging device according to claim 1, wherein
a specific pixel of the first type of pixels of the set of light shielding pixels includes the specific photoelectric conversion unit, and
a pixel size of each of the first type of pixels is smaller than a pixel size of each of the second type of pixels.
4. The solid-state imaging device according to claim 1, wherein
a pixel size of each of the first type of pixels is smaller than a pixel size of each of the second type of pixels, and
a pixel of the first type of pixels corresponds to a low-sensitivity pixel that has a lower light sensitivity than a pixel of the second type of pixels.
5. The solid-state imaging device according to claim 1, wherein the trench part is between a third photoelectric conversion unit of the first plurality of photoelectric conversion units and a fourth photoelectric conversion unit of the first plurality of photoelectric conversion units.
6. The solid-state imaging device according to claim 1, wherein
the dug structure includes a plurality of recesses,
the plurality of recesses is dug in toward a light incident surface side of the substrate, and
the plurality of recesses scatters incident light.
7. The solid-state imaging device according to claim 1, wherein the p-type semiconductor region is doped with at least one of boron or difluoroboron.
8. An electronic device, comprising:
a solid-state imaging device that includes:
a substrate;
a pixel region on the substrate, wherein
the pixel region includes an array of a plurality of pixels,
the plurality of pixels includes a plurality of photoelectric conversion units,
a first pixel of the plurality of pixels includes a first photoelectric conversion unit of the plurality of photoelectric conversion units,
a second pixel of the plurality of pixels includes a second photoelectric conversion unit of the plurality of photoelectric conversion units,
the first pixel is adjacent to the second pixel,
the plurality of photoelectric conversion units includes a first plurality of photoelectric conversion units that is not shielded from light, and a second plurality of photoelectric conversion units that is shielded from the light,
the plurality of pixels includes a set of effective pixels and a set of light shielding pixels,
each of the set of effective pixels and the set of light shielding pixels includes a first type of pixels and a second type of pixels, and
a size of the first type of pixels is different from a size of the second type of pixels;
a dug structure in the pixel region, wherein the dug structure includes a trench part in a region between the first photoelectric conversion unit of the first pixel and the second photoelectric conversion unit of the second pixel; and a p-type semiconductor region in a region adjacent to the dug structure in the substrate, wherein the pixel region further includes an effective pixel region and an optical black (OPB) pixel region, the effective pixel region includes the set of effective pixels that includes the first plurality of photoelectric conversion units, a first portion of the trench part is in the effective pixel region, the first portion of the trench part surrounds each of the first plurality of photoelectric conversion units, the OPB pixel region is adjacent to the effective pixel region, the OPB pixel region includes the set of light shielding pixels that includes the second plurality of photoelectric conversion units, a second portion of the trench part is in the OPB pixel region, the second portion of the trench part surrounds a specific photoelectric conversion unit of the second plurality of photoelectric conversion units, one of the first type of pixels of the set of light shielding pixels or the second type of pixels of the set of light shielding pixels includes the specific photoelectric conversion unit, and in a plan view, a percentage of an area of the second portion of the trench part in the OPB pixel region is smaller than a percentage of an area of the first portion of the trench part in the effective pixel region.

\* \* \* \* \*